US009190334B2

(12) United States Patent
Thomas et al.

(10) Patent No.: US 9,190,334 B2
(45) Date of Patent: Nov. 17, 2015

(54) SOI INTEGRATED CIRCUIT COMPRISING ADJACENT CELLS OF DIFFERENT TYPES

(75) Inventors: Olivier Thomas, Revel (FR); Jerome Mazurier, Cestas (FR); Nicolas Planes, La Terrasse (FR); Olivier Weber, Grenoble (FR)

(73) Assignees: Commissariat à l'énergie atomique et aux énergies alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 316 days.

(21) Appl. No.: 13/606,974

(22) Filed: Sep. 7, 2012

(65) Prior Publication Data

US 2013/0065366 A1    Mar. 14, 2013

(30) Foreign Application Priority Data

Sep. 8, 2011    (FR) .................................. 11 57997

(51) Int. Cl.
*H01L 21/70*    (2006.01)
*H01L 21/84*    (2006.01)
*H01L 27/11*    (2006.01)
*H01L 27/12*    (2006.01)
*H01L 27/105*    (2006.01)
*H01L 21/00*    (2006.01)
*H01L 21/8238*    (2006.01)
(Continued)

(52) U.S. Cl.
CPC ............ *H01L 21/84* (2013.01); *H01L 27/1052* (2013.01); *H01L 27/1104* (2013.01); *H01L 27/1203* (2013.01); *H01L 21/823892* (2013.01); *H01L 27/0928* (2013.01); *H01L 29/78648* (2013.01)

(58) Field of Classification Search
None
See application file for complete search history.

(56) References Cited

U.S. PATENT DOCUMENTS

| 6,063,686 A * | 5/2000 | Masuda et al. ................. 438/406 |
| 2003/0207504 A1 | 11/2003 | Fuselier et al. |
| 2005/0047196 A1 | 3/2005 | Bhavnagarwala et al. |

(Continued)

FOREIGN PATENT DOCUMENTS

| JP | 2004006985 | 1/2004 |
| JP | 2006080549 | 3/2006 |

OTHER PUBLICATIONS

Mazurier et al., "On the Variability in Planar FDSOI Technology: From MOSFETs to SRAMs," Electron Devices, IEEE Transactions on Electron Devices, Aug. 2011, vol. 58, Issue 8, pp. 2326-2336.

(Continued)

*Primary Examiner* — Calvin Choi
(74) *Attorney, Agent, or Firm* — Occhiuti & Rohlicek LLP (57) ABSTRACT

An integrated circuit on a semiconductor substrate has logic gates comprising FDSOI-type transistors made on said substrate, including at least one first transistor comprising a gate with a first work function, and including a transistor comprising a second work function, a memory including memory cells, each memory cell comprising FDSOI type transistors, including at least one third nMOS transistor with a gate presenting a third work function, the third transistor comprising a buried insulating layer and a ground plane at least one fourth pMOS transistor with a gate presenting said third work function, the fourth transistor comprising a buried insulating layer and a ground plane, the ground planes of the third and fourth transistors being made in a same well separating these ground planes from said substrate.

13 Claims, 7 Drawing Sheets

(51) Int. Cl.
*H01L 27/092* (2006.01)
*H01L 29/786* (2006.01)

(56) References Cited

U.S. PATENT DOCUMENTS

| | | | |
|---|---|---|---|
| 2006/0046408 | A1 | 3/2006 | Ohsawa |
| 2007/0063284 | A1 | 3/2007 | Kawahara et al. |
| 2009/0003105 | A1* | 1/2009 | Itoh et al. ............ 365/203 |
| 2009/0134468 | A1 | 5/2009 | Tsuchiya et al. |
| 2012/0299105 | A1* | 11/2012 | Cai et al. ............. 257/348 |

OTHER PUBLICATIONS

Weber et al., "Work-function Engineering in Gate First Technology for Multi-$V_T$ Dual-Gate FDSOI CMOS on UTBOX," Electron Devices Meeting (IEDM), 2010 IEEE International, Dec. 2010.

Andrieu et al., "Low Leakage and Low Variability Ultra-Thin Body and Buried Oxide (UT2B) SOI Technology for 20nm Low Power SMOS and Beyond," 2010 Symposium on VLSI Technology (VLSIT), Jun. 2010.

* cited by examiner

SOI INTEGRATED CIRCUIT COMPRISING ADJACENT CELLS OF DIFFERENT TYPES

RELATED APPLICATIONS

Under 35 USC 119, this application claims the benefit of the priority date of French application FR 1,157,997, filed on Sep. 8, 2011, the contents of which are herein incorporated by reference.

FIELD OF INVENTION

The invention pertains to integrated circuits and especially to integrated circuits on a silicon-on-insulator (SOI) type substrate. SOI technology consists in separating a thin layer of silicon (a few nanometers thick) from a silicon substrate by a relatively thick (generally a few tens of nanometers) layer of insulator.

BACKGROUND

In most advanced integrated circuits, the embedded memory blocks amount to more than half of the total surface area of the circuit. In the future, it is expected that the memory blocks will exceed more than 70% of the total surface area of the circuit. The surface area of the memory cell therefore plays a vital role in the race towards miniaturization. For many years, the gain in integration density has been obtained by reducing the different dimensions of the transistors (the front end), the contacts (the middle end) and the metals (the back end), enabling the integration of ever-increasing numbers of memory cells on a given surface area of substrate.

The reduction of certain dimensions in the transistors has led to the appearance of parasitic physical effects which become non-negligible (in terms of variation of dopants, short channel effects, etc.) and affect miniaturization. Novel materials have therefore appeared along with novel transistor architectures in order to compensate for these parasitic effects.

However, the use of novel materials and/or novel architectures generally leads to difficulties of manufacture and/or problems of reliability of the integrated circuit. Similarly, the use of a novel type of transistor entails problems in terms of portability and compatibility of the already existing circuits as well as the circuit techniques used to improve performance.

Integrated circuits made with SOI technology have a certain number of advantages. Such circuits generally show lower static and dynamic electricity consumption for equivalent performance, owing to better electrostatic control of the channel by the gate. Because there is a non-doped channel, the dispersions of the electrical characteristics are also smaller. Such circuits generally result in lower parasitic capacitances, thus improving switching speed. Furthermore, the latch-up or parasitic triggering phenomenon encountered by CMOS transistors in bulk technology can be avoided to the benefit of operating robustness, owing to the presence of the insulating oxide layer. Such circuits therefore prove to be particularly suited to SoC type applications. It is generally noted that SOI integrated circuits are less sensitive to the effects of ionizing radiation and hence prove to be more reliable in applications where such radiation can give rise to operational problems, especially in space applications. SOI integrated circuits can especially include SRAM random-access memories or logic gates. The making of SOI integrated circuits also remains relatively similar to that of bulk technology.

Reducing the static consumption of logic gates while at the same time increasing their switchover speed has been the subject of much research. Certain integrated circuits being developed integrate both low-consumption logic gates and high-switching-speed logic gates. To generate both these types of logic gates on a same integrated circuit, fast-access logic gates or low-consumption logic gates are chosen from libraries of logic gates. In bulk technology, the threshold voltage level of transistors of a same type is modulated by differentiating their channel doping level. However, in FDSOI (Fully Depleted Silicon-On-Insulator) technology, the doping of the channel is almost zero. Thus, the channel doping level in the transistors cannot show major variations without losing the associated advantages, and this fact makes it impossible to differentiate the threshold voltages by bringing this doping into play. The threshold voltages in non-doped channel FDSOI technology are thus essentially determined by the work function of the gate. For nMOS transistors, a work function slightly below the midgap, known as an N-type work function, is generally desired to obtain threshold voltages between 0.2 and 0.5V. Symmetrically, for pMOS transistors, a work function slightly above the midgap, called a P-type work function, is generally desired to obtain threshold voltages between −0.2 and −0.5V.

In order to have distinct threshold voltages for different FDSOI technology transistors, there are also known ways of using a biased ground plane placed between an insulating thin-oxide layer and the silicon substrate. By playing on the doping of the ground planes and on their biasing, it is possible to define a range of threshold voltages for the different transistors. We could thus have low-voltage-threshold or LVT transistors, high-voltage-threshold or HVT transistors and medium or standard-voltage-threshold or SVT transistors.

Figure 1A:
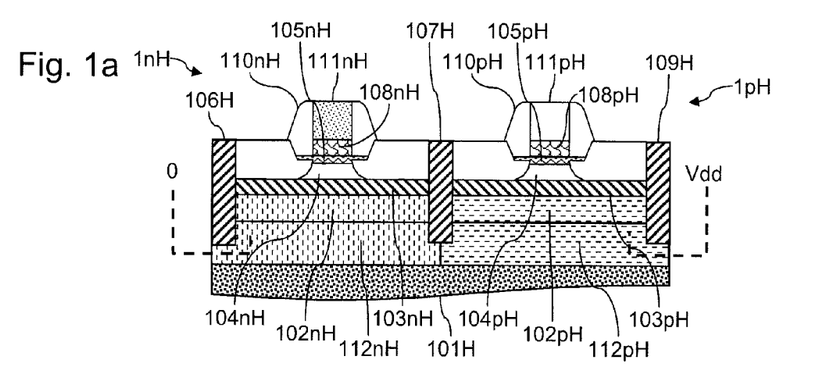
FIGS. 1a to 1c are views in section of the pairs of FDSOI transistors of different types according to the prior art.
Figure 1B:
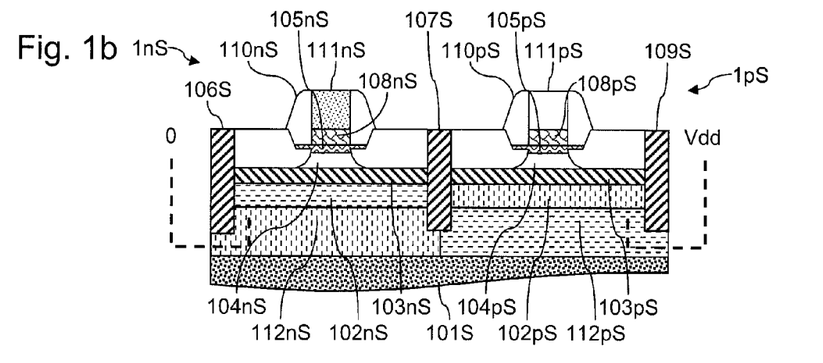
Figure 1C:
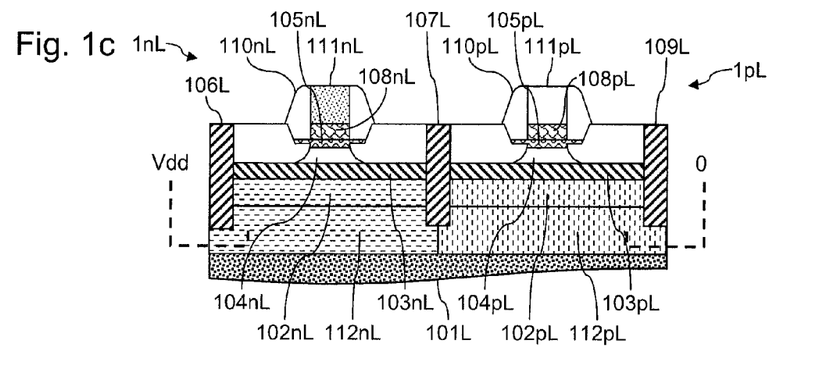

For certain functions of the circuit, it is possible to combine transistors of a same type, for example LVT or HVT transistors, in a same region. However, certain functions of the circuit require the contiguous joining of different types of transistors with ground planes having different biases. The designing of such functions of the circuit proves to be relatively difficult because additional designing constraints have to be taken into account. FIGS. 1a to 1c provide an example of pairs of nMOS and pMOS transistors of different types, namely HVT, SVT and LVT types respectively.

FIG. 1a shows an example of a pair of HVT-type transistors, namely an nMOS transistor 1nH and a pMOS transistor 1pH. The transistors 1nH and 1pH are made with SOI technology. The transistors 1nH and 1pH are made on a layer of silicon substrate 101H. The transistors 1nH and 1pH comprise respective buried insulating layers, 103nH and 103pH, separated from the substrate layer 101H by means of respective ground planes 102nH and 102pH and wells 112nH and 112pH. The insulating layers 103nH and 103pH are surmounted by an active silicon layer. The active silicon layer of the transistor 1nH comprises a source, a channel 104nH and a drain. The active silicon layer of the transistor 1pH comprises a source, a channel 104pH and a drain. The ground planes 102nH and 102pH enable the electrostatic control of the transistor to be improved by limiting the penetration of the electrical fields generated by the drain and the source beneath the channel 104nH and 104pH. The reduction of the lateral electrostatic coupling reduces short-channel effects and limits the drain-induced depletion effect through DIBL. The channels 104nH and 104pH are lined respectively with gate oxide layers 105nH and 105pH. The gate oxides 105nH and 105pH are surmounted by respective gate stacks comprising metal layers 108nH and 108pH and polysilicon layers 111nh and 111ph. The stacks are demarcated laterally by spacers 110$n$H and 110$p$H. Insulation trenches 106H, 107H and 109H are placed around the transistors 1$n$H and 1$p$H.

To obtain HVT type transistors, the ground plane 102$n$H has P-type doping and is biased to ground, and the ground plane 102$p$H has an N-type doping and is biased to Vdd, and thin BOX insulating layers 103$n$H and 103$p$H, (with a typical thickness of 10 to 50 nm) are used. The ground plane 102$n$H could also be biased to a voltage ranging from Gnds (Gnds being a voltage below ground voltage Gnd) and Vdd/2. The ground plane 102$p$H could also be biased to a voltage ranging from Vdd/2 (Vdd being a high-level voltage) to VddH (VddH>Vdd). The wells 112$n$H and 112$p$H have respective P-type and N-type dopings. The ground planes 102$n$H and 102$p$H are biased by means of wells 112$n$H and 112$p$H respectively.

FIG. 1$b$ shows an example of a pair of SVT-type transistors, namely an nMOS transistor 1$n$S and a pMOS transistor 1$p$S. The transistors 1$n$S and 1$p$S have substantially the same structure as the transistors 1$n$H and 1$p$H: they are made on a silicon substrate layer 101S comprising respective buried insulating layers 103$n$S and 103$p$S separated from the substrate layer 101S by means of the respective ground planes 102$n$S and 102$p$S and wells 112$n$S and 112$p$S. The insulating layers 103$n$S and 103$p$S are surmounted by an active silicon layer. The active silicon layer of the transistor 1$n$S has a source, a channel 104$n$S and a drain. The active silicon layer of the transistor 1$p$S has a source, a channel 104$p$S and a drain. The channels 104$n$S and 104$p$S are lined respectively by gate oxide layers 105$n$S and 105$p$S. The gate oxide layers 105$n$S and 105$p$S are surmounted by respective gate stacks comprising metal layers 108$n$S and 108$p$S and polysilicon layers 111$n$S and 111$p$S. The stacks are demarcated laterally by spacers 110$n$S and 110$p$S. Insulating trenches 106S, 107S and 109S are placed around the transistors 1$n$S and 1$p$S.

To obtain SVT type transistors, the ground plane 102$n$S has an N-type doping and is biased to ground and the ground plane 102$p$S has P-type doping and is biased to Vdd, and thin insulating BOX layers 103$n$S and 103$p$S are used. The ground plane 102$n$S could also be biased to a voltage ranging from Gnds (with Gnds<Gnd) and Vdd/2. The ground plane 102$p$S could also be biased to a voltage of Vdd/2 to VddH. The wells 112$n$S and 112$p$S have respective P-type and N-type dopings. The biasing of the ground planes 102$n$S and 102$p$S is done by means of the wells 112$n$S and 112$p$S respectively.

FIG. 1$c$ shows an example of a pair of LVT-type transistors comprising an nMOS transistor 1$n$L and a pMOS transistor 1$p$L. The transistors 1$n$L and 1$p$L have substantially the same structure as the transistors 1$n$H and 1$p$H: they are made on a silicon substrate layer 101L comprising respective buried insulating layers 103$n$L and 103$p$L separated from the substrate layer 101H by means of respective ground planes 102$n$L and 102$p$L and wells 112$n$L and 112$p$L. The insulating layers 103$n$L and 103$p$L are surmounted by an active silicon layer. The active silicon layer of the transistor 1$n$L has a source, a channel 104$n$L and a drain. The active silicon layer of the transistor 1$p$L has a source, a channel 104$p$L and a drain. The channels 104$n$L and 104$p$L are lined respectively with gate oxide layers 105$n$L and 105$p$L. The gate oxides 105$n$L and 105$p$L are surmounted by respective gate stacks comprising metal layers 108$n$L and 108$p$L and polysilicon layers 111$n$L and 111$p$L. The stacks are demarcated laterally by spacers 110$n$L and 110$p$L. Insulating trenches 106L, 107L and 109L are placed around the transistors 1$n$L and 1$p$L.

To obtain LVT type transistors, the ground plane 102$n$L has an N-type doping and is biased to Vdd and the ground plane 102$p$L has P-type doping and is biased to ground, and thin insulating BOX layers 103$n$L and 103$p$L are used. The ground plane 102$n$H could also be biased to a voltage of Vdd/2 to VddH. The ground plane 102$p$H could also be biased to a voltage of Gnds to Vdd/2. The wells 112$n$L and 112$p$L have respective N-type and P-type dopings. The ground planes 102$n$L and 102$p$L are biased by means of the wells 112$n$L and 112$p$L respectively.

It is also possible to integrate different gate materials for these transistors to modify the threshold voltages of the different transistors. To this end, it is possible to use different types of doping in the polysilicon layers, make different types of polysilicon layers or use different materials in the metal layers so as to obtain gates with distinct work functions.

These technical solutions provide for a specialization of the transistors in the logic gates and the memory cells of the integrated circuit. The characteristics of the integrated circuits designed may thus be more specifically defined.

The process of implanting dopants in the structure leads to undesirable variations in concentration at the edge of the implantations, inducing undesirable doping of the channel of the transistors. At the scale of the integrated circuits used, these variations take the form of effects known as WPE (well proximity effects) that are not negligible and affect the reliability and efficiency of manufacture of such circuits. The use of different gate materials also has non-negligible consequences on the complexity of the manufacturing process and its efficiency, especially as the integrated circuit has high density.

SUMMARY OF THE INVENTION

The invention is aimed at resolving one or more of these drawbacks. The invention thus relates to an integrated circuit comprising a semiconductor substrate and comprising: logic gates comprising FDSOI-type transistors made on said substrate, including at least one first transistor comprising a gate with a first work function, and including at least one second transistor comprising a gate with a work function distinct from the first one; a memory including memory cells, each memory cell comprising FDSOI type transistors, of which: at least one third transistor is an nMOS type transistor and comprises a gate presenting a third work function, the third transistor comprising a buried insulating layer and a ground plane separating the buried insulating layer from said substrate, and at least one fourth transistor is of a pMOS type and comprises a gate presenting said third work function, the fourth transistor comprising a buried insulating layer and a ground plane separating the buried insulating layer from said substrate, the ground planes of the third and fourth transistors having a same doping and the ground planes of the third and fourth transistors being made in a same well separating these ground planes from said substrate, the ground planes of the third and fourth transistors being adapted to being biased in the same way.

According to one variant, said well is a well with P-type doping, said well being separated from the substrate by means of a deep n-well.

According to yet another variant, the first and second transistors comprise a buried insulating layer and a respective ground plane separating the buried insulating layer from said substrate, the type of doping of the ground planes of the first and second transistors being distinct.

According to another variant, the first and second transistors comprise a buried insulating layer and a respective ground plane separating the buried insulating layer from said substrate, the biasing of the ground planes of the first and second transistors being distinct.

According to yet another variant, the buried insulating layer of the third and fourth transistors has a thickness of less than 50 nm.

According to one variant, the third work function is substantially identical to the first or second work function.

According to one variant, the respective gates of the first to fourth transistors include a polysilicon layer, the gate presenting the first work function having a doping of a first type, the gate presenting the second work function having a doping of a second type opposite the first type and the gate presenting the third work function having a doping of the first or second type.

According to yet another variant, each memory cell furthermore has fifth and sixth FDSOI transistors:
the fifth transistor being of an nMOS type and comprising a gate presenting a third work function, the fifth transistor comprising a buried insulating layer and a ground plane separating the buried insulating layer from said substrate;
the sixth transistor being of an pMOS type and comprising a gate presenting a third work function, the sixth transistor comprising a buried insulating layer and a ground plane separating the buried insulating layer from said substrate.

According to one variant, the memory is of a SRAM type.

According to yet another variant, the integrated circuit comprises a circuit for biasing the ground planes of the third and fourth transistors, said biasing circuit being configured to dynamically modify the biasing applied to the ground planes of the third and fourth transistors.

According to yet another variant, the ground planes of the set of transistors of the memory cells are made in a same well.

BRIEF DESCRIPTION OF THE DRAWINGS

Other features and advantages of the invention shall emerge clearly from the following description, made by way of an indication that is no way exhaustive, and with reference to the appended drawings, of which.

DETAILED DESCRIPTION OF THE INVENTION

Figure 2:
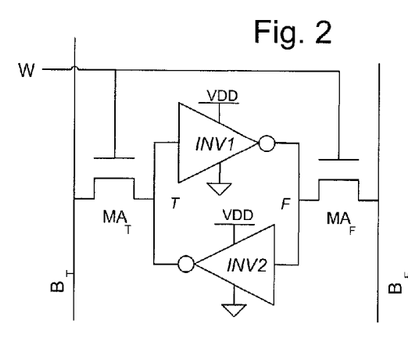
FIG. 2 is a schematic view of a memory cell.

As illustrated in FIG. 2, a SRAM memory cell consists of two inverters Inv1 and Inv2 connected in a bistable flip-flop configuration and two access transistors MAT and MAF connected to bit lines BLT and BLF. The access transistors MAT and MAF are controlled by a word line WL. The requirements that the memory cell must meet are:
sufficient stability ensuring the operation of the cell during read, write and retention operations;
a maximum conduction current to increase the speed of access to the cell;
a minimum cell size to increase the integration density; and
a minimum retention current to reduce the static electrical consumption.

Figure 3:
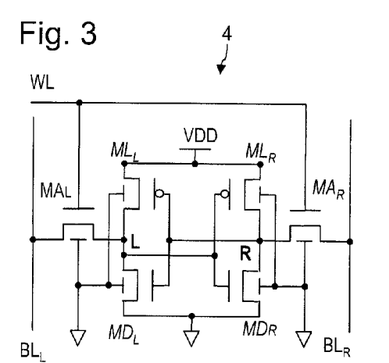
FIG. 3 is an electrical drawing of a first example of a 6T type memory cell.

FIG. 3 is an electrical diagram of a 6T type memory cell 4 of an integrated circuit according to the invention. The memory cell 4 of FIG. 3 is designed to optimize electrical consumption with improved efficiency and improved functions by reducing causes of dispersions, and enabling simplified dynamic control of the biasing voltages over a wide range. In a manner known per se, the memory cell 4 comprises two nMOS-type access transistors $MA_L$ and $MA_R$, two nMOS-type conduction transistors $MD_L$ and $MD_R$ and two pMOS-type load transistors $ML_L$ and $ML_R$. The conduction transistors $MD_L$ and $MD_R$ and the load transistors $ML_L$ and $ML_R$ are connected in a manner known per se to form a bistable flip-flop circuit having storage nodes L and R. The storage nodes L and R are selectively connected to the voltage Vdd respectively by means of the load transistors $ML_L$ and $ML_R$. The storage nodes L and R are selectively connected to ground by means of the conduction transistors $MD_L$ and $MD_R$ respectively. The storage nodes L and R are selectively to the bit lines $BL_L$ and $BL_R$ respectively by means of the access transistors $MA_L$ and $MA_R$. The gates of the access transistors $MA_L$ and $MA_R$ are connected to a word line WL. The gate of the load transistor $ML_L$ and the gate of the conduction transistor $MD_L$ are connected to the storage node R. The gate of the load transistor $ML_R$ and the gate of conduction transistor $MD_R$ are connected to the storage node L. The use of the nMOS-type access transistors $MA_L$ and $MA_R$ theoretically provides for fast access to the storage nodes of the memory cell 4 as compared with pMOS transistors of identical surface area.

The nMOS transistors $MA_L$ and $MD_L$ are made on a BOX insulating layer and overhang a ground plane. The nMOS transistors $MA_R$ and $MD_R$ are made on a thin BOX insulating layer overhanging another ground plane. The pMOS-type load transistors $ML_L$ and $ML_R$ are made on a BOX insulating layer and overhang a ground plane. The doping of the ground planes of the transistors of the memory cell 4 is identical. The biasing of these ground planes is also identical. In this example, the ground planes of the transistors are all connected to the ground potential. In the different variants illustrated here below, different dopings and different biases of these ground planes shall be described in detail.

Figure 4:
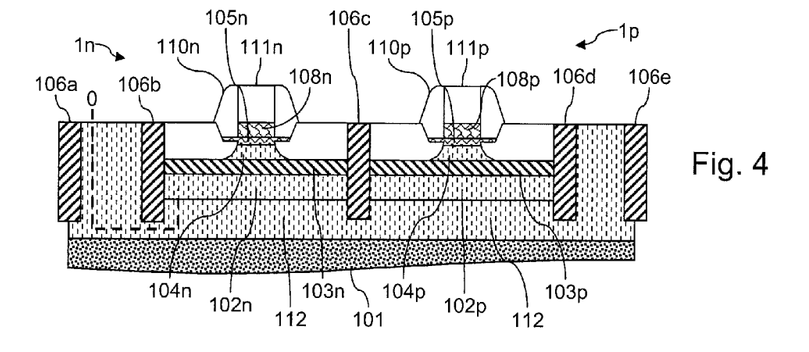
FIG. 4 is a view in section of a nMOS transistor and a pMOS transistor contiguously joined together in a first variant of a 6T memory.

FIG. 4 represents an example of an nMOS transistor 1n and a pMOS transistor 1p contiguously joined together in the memory cell 4 of FIG. 3. The transistors 1n and 1p are made with FDSOI technology. The transistors 1n and 1p are made on a silicon substrate layer 101. The transistors 1n and 1p comprise respective buried insulating layers 103n and 103p, separated from the substrate layer 101 by means of respective P-doped ground planes 102n and 102p and a P-doped well 112. The buried insulating layers 103n and 103p are in practice formed in a same insulating layer extending so as to be plumb with the substrate 101. The insulating layers 103n and 103p are surmounted by an active silicon layer. The active silicon layer of the transistor 1n has an N-doped source, a channel 104n and an N-doped drain. The active silicon layer of the transistor 1p comprises a P-doped source, a channel 104p and a P-doped drain. The ground planes 102n and 102p improve the electrostatic control of the transistor in limiting the penetration of the electrical fields generated by the drain and the source beneath the 104n or 104p. The reduction of the lateral electrostatic coupling reduces the short channel effects and limits drain depletion effect by DIBL. The channels 104n and 104p are respectively lined with gate oxide layers 105n and 105p. The gate oxide layers 105n and 105p are surmounted by respective gate stacks comprising metal layers 108n and 108p and polysilicon layers 111n and 111p. The stacks are demarcated laterally by spacers 110n and 110p. Insulation trenches 106a to 106e are placed around the transistors 1n and 1p.

The buried insulating layers 103n and 103p have a thickness known as ultra-thin, typically ranging from 10 to 50 nm. The ground planes 102n and 102p have a same P-type doping. The ground planes 102n and 102p are biased to ground by means of the well 112. Although not all the transistors of the cell 4 are illustrated, all these transistors have P-doped ground planes, and are biased to ground (this bias could be adjusted over a very wide range, for example between-vdd and vdd). Moreover, all the transistors of the cell 4 are made plumb with the same well 112. Besides, all the transistors of the cell 4 have a same gate composition. In this case, the composition of the metal layers, the polysilicon layers and the gate oxide layers of the transistors of the cell 4 is identical.

For gates configured to present an N-type work function (i.e. a work function lower than the work function of silicon, for example 4.45 eV):
  the nMOS transistors are of a VTL type (i.e. their threshold voltage is lower than that of a same transistor provided with a mid-gap gate);
  the pMOS transistors are of a VTH type (i.e. their threshold voltage is higher than that of a same transistor provided with a mid-gap gate);

Owing to the use of a same gate composition and of a same ground plane doping for the transistors of the memory cell 4, the manufacturing efficiency for such very high density cells can be very high as the well proximity effects (WPE) and the failure factor due to double-gate processes are eliminated in these cells (with elimination of "crossed-corners": i.e. slow nMOS/fast pMOS or fast nMOS/slow pMOS configurations).

Besides, owing to a unique biasing of the ground planes of these transistors, the control of the threshold voltage by the variation of this biasing proves to be particularly simple.

The cell 4 furthermore has:
  high stability in retention because the threshold voltages of the transistors are adjustable by the biasing of the ground planes, thus enabling the threshold voltages to be balanced;
  a more efficient SNM-WM (Static Noise Margin and Write Margin) compromise because the threshold voltages of the transistors are adjustable by the biasing of the ground planes;
  a range of operation increased through the adjustment of the threshold voltages by the ground planes.

On the same silicon substrate 101, a logic block has logic gates made in the integrated circuit according to the invention. These logic gates are advantageously designed to meet the design requirements by which they must have different electrical characteristics (switching speed or low electrical consumption for example).

The transistors of these logic gates are also of an FDSOI type and have different work functions so that they can have threshold voltages at desired levels. Certain transistors of the logic gates could thus have gates with a midgap-type of work function (the work function of which is situated in the middle of the work function of silicon, i.e. about 4.65 eV), gates having a P-type work function (work function greater than the work function of silicon, i.e. for example 4.85 eV) and/or gates with an N-type work function (work function below the work function of silicon, i.e. for example 4.45 eV). A logic gate will generally comprise transistors having similar threshold voltages, for example to favor low consumption or fast switching. Different logic gates could have transistors with distinct threshold voltages according to the desired electrical properties.

For an nMOS transistor:
  the use of a gate with a P-type work function makes it possible to increase the minimum value and the maximum value of the voltage threshold range as a function of the bias, as compared with a same transistor having a midgap-type gate;
  the use of a gate with an N-type work function makes it possible to reduce the minimum value and the maximum value of the voltage threshold range as a function of the bias of the ground plane, as compared with a same transistor having a midgap-type gate.

For a pMOS transistor:
  the use of a gate with an N-type work function makes it possible to increase the minimum value and the maximum value of the voltage threshold range as a function of the bias, as compared with a same transistor having a midgap type gate;
  the use of a gate with a P-type work function makes it possible to reduce the minimum value and the maximum value of the voltage threshold range as a function of the bias of the ground plane, as compared with a same transistor having a midgap-type gate.

Such transistors are advantageously combined to form circuits integrating logic gates with very high density. The formation of logic gates implies the association of nMOS and pMOS transistors contiguously joined together. When it is desired to contiguously join together logic gates provided with transistors having distinct threshold voltages, the nMOS transistors and the pMOS transistors are arranged in alternating rows. To contiguously join an nMOS/pMOS pair having threshold voltage VTH with an nMOS/pMOS pair having threshold voltage VTL with ultra-thin insulating layers and biased ground planes, it is possible to make n and p wells in a checkerboard pattern to apply an appropriate bias to each ground plane.

Figure 9:
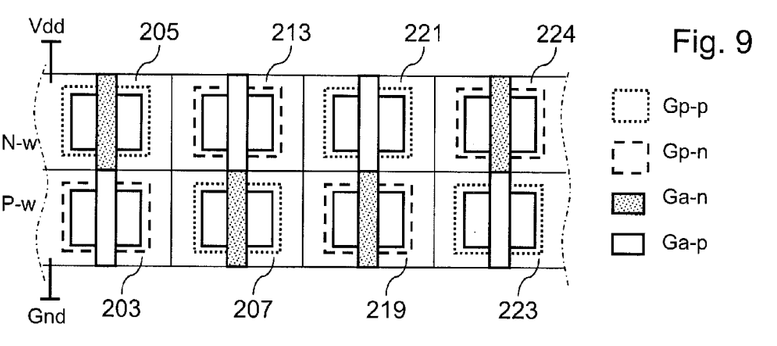
FIGS. 9 to 11 illustrate an example of a layout of transistors with logic gates having different threshold voltages in playing on the output work functions of their gates.
Figure 10:
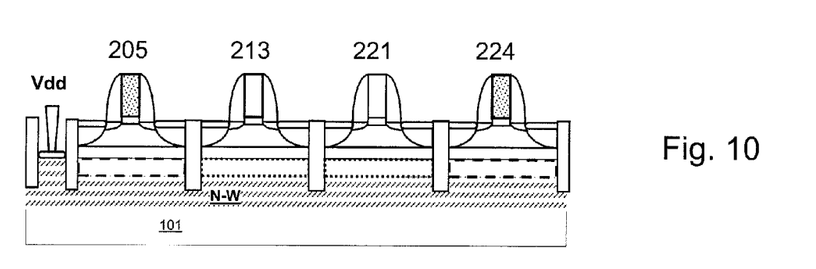
Figure 11:
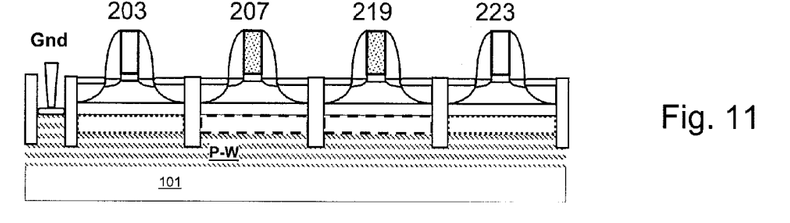

FIG. 9 is a schematic illustration of a part of an integrated circuit comprising transistors with different threshold voltages for the formation of logic gates. For example, if the gate material is deemed to have a greater impact than the doping of the ground plane on the threshold voltage in this structure, then the nMOS transistors are laid out in a row and the pMOS transistors are laid out in a row that is contiguously joined to it. The nMOS transistors correspond to the references 203 (HVT), 207 (VTS), 219 (VTL) and 223 (SHVT for the greatly raised threshold voltage), illustrated in section in FIG. 11. The pMOS transistors correspond to the references 205 (HVT), 213 (VTS), 221 (VTL) and 224 (SHVT), illustrated in section in FIG. 10. Such a structure enables the making of a same P-doped well (P-w) in strip form beneath a row of nMOS transistors and the application to it of a common bias, for example to ground. Such a structure also enables the making of a same N-doped well (N-w) in strip form beneath a row of pMOS transistors and the application to it of a common bias, for example to Vdd. The integration density of the transistors can thus be optimized in limiting the use of the insulation trenches. Gp-p designates a ground plane with P-type doping, Gp-n designates a ground plane with N-type doping. Ga-n designates a gate with an N-type work function. Ga-p designates a gate with P-type work function.

Since the constraint of integration density is generally lower at the logic gates, the use of a larger number of technological parameters, such as the gate composition or the doping of the ground planes, induces relatively limited WPE type effects and the logic gates are therefore more robust and, therefore, more sensitive.

Thus, the invention surprisingly makes it possible to obtain the choice of performance desired for the logic gates and to furthermore obtain memory cells that are both reliable and perform well, despite the relinquishment of certain factors of modulation of the threshold voltage, without impairing the efficiency of production of the integrated circuit.

To simplify the manufacturing process, the composition of the transistor gates of the memory cells 4 will advantageously be identical to the composition of the gate of certain transistors of the logic gates.

Figure 5:
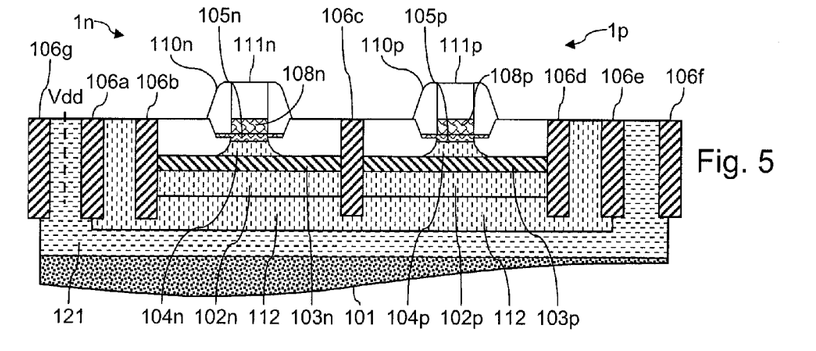
FIG. 5 is a view in section of a nMOS transistor and a pMOS transistor contiguously joined together in a second variant of a 6T memory.

FIG. 5 shows a second variant of the transistors of the memory cell 4. An nMOS transistor 1$n$ and a pMOS transistor 1$p$ are contiguously joined together in the memory cell 4. The transistors 1$n$ and 1$p$ are made with FDSOI technology.

The transistors 1$n$ and 1$p$ have substantially the same structure as the transistors of the memory cell of FIG. 4. In this variant, the P-doped well 112 is separated from the substrate 101 by means of a deep n-well. The well 121 is biased to Vdd. Separation trenches 106$a$ and 106$f$ delimit this well laterally 121.

The well 121 and its biasing provide for an insulation of the well 112 relatively to other P-doped wells. Thus, a specific bias can be applied to the well 112 of the memory cell 4, independently of the bias of other adjacent P-doped wells. The well 112 could for example be biased to a desired voltage ranging from −Vdd to the voltage of the well 121 (+Vdd in this case).

Owing to the use of a same gate composition and a same ground plane doping for the transistors of the memory cell 4, the efficiency of manufacture of such cells with very high density can be very great, the failure factor due to the double-gate processes being eliminated in these cells along with the elimination of the well proximity effects (WPE).

Besides, owing to a unique biasing of the ground planes of these transistors, the control of the threshold voltage by the variation of this bias proves to be particularly simple.

The cell 4 furthermore has:
high stability in retention because the threshold voltages of the transistors are adjustable by the biasing of the ground planes, thus enabling the threshold voltages to be balanced;
a more efficient SNM-WM compromise because the threshold voltages of the transistors are adjustable by the biasing of the ground planes;
a range of operation increased through the adjustment of the threshold voltages by the ground planes.

Figure 6:
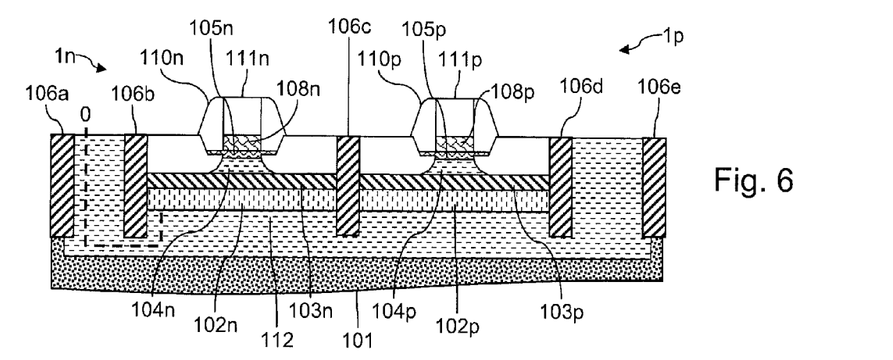
FIG. 6 is a view in section of a nMOS transistor and a pMOS transistor contiguously joined together in a third variant of a 6T memory.

FIG. 6 shows a third variant of the transistors of the memory cell 4. An nMOS transistor 1$n$ and a pMOS transistor 1$p$ are contiguously joined together in the memory cell 4. The transistors 1$n$ and 1$p$ are made by FDSOI technology. The transistors 1$n$ and 1$p$ include respective buried insulating layers 103$n$ and 103$p$, separated from the substrate layer 101 by means of respective P-doped ground planes 102$n$ and 102$p$ and an N-doped well 112. The insulating layers 103$n$ and 103$p$ are surmounted by an active silicon layer, with a structure identical to that of the first and second variants.

The buried insulating layers 103$n$ and 103$p$ have a thickness called an ultra-thin thickness, typically ranging from 10 to 50 nm. The ground planes 102$n$ and 102$p$ have a same P-type doping. The ground planes 102$n$ and 102$p$ are biased by means of the well 112. Although the transistors of the cell 4 are not illustrated, all these transistors have P-doped ground planes with a same bias. In addition, all the transistors of the cell 4 are made plumb with the same well 112. Besides, all the transistors of the cell 4 have a same gate composition. It so happens that the composition is identical for the metal layers, the polysilicon layers and the gate oxide layers of the transistors of the cell 4.

Since the N-doped well 112 is naturally insulated from the substrate 101, a voltage ranging from the voltage of the substrate 101 to the voltage Vdd can be applied to this well 112 in order to bias the ground planes 102$n$ and 102$p$.

Figure 7:
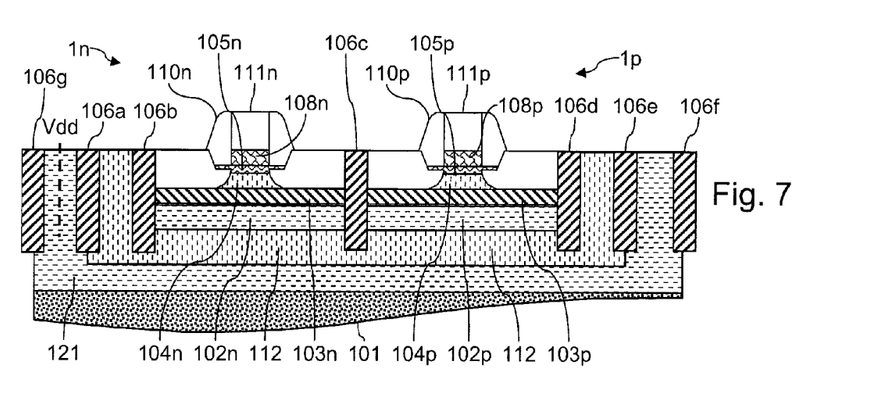
FIG. 7 is a view in section of a nMOS transistor and a pMOS transistor contiguously joined together in a fourth variant of a 6T memory.

FIG. 7 shows a fourth variant of the transistors of the memory cell 4. An nMOS transistor 1$n$ and a pMOS transistor 1$p$ are contiguously joined together in the memory cell 4. The transistors 1$n$ and 1$p$ are made by FDSOI technology. The transistors 1$n$ and 1$p$ include respective buried insulating layers 103$n$ and 103$p$ made on the respective ground planes 102$n$ and 102$p$. The ground planes 102$n$ and 102$p$ are N-doped and made in a P-doped well 112. The well 112 is separated from the substrate 101 by means of a deep n-well 121. The insulating layers 103$n$ and 103$p$ are surmounted by an active silicon layer, having a structure identical to that of the first to third variants. The well 121 is biased to Vdd. Separation trenches 106$a$ and 106$f$ laterally delimit this well 121. This fourth variant differs from the second variant solely by an N-type doping of the ground planes of the memory cell 4.

Such a memory cell 4 is intended for optimizing the switching time of its transistors and the write margin of the cell, to the detriment of its stability. Indeed, as compared with the transistors of the second variant, the nMOS transistors of this fourth variant have a lower threshold voltage and the pMOS transistors of this fourth variant have a higher threshold voltage.

Figure 8:
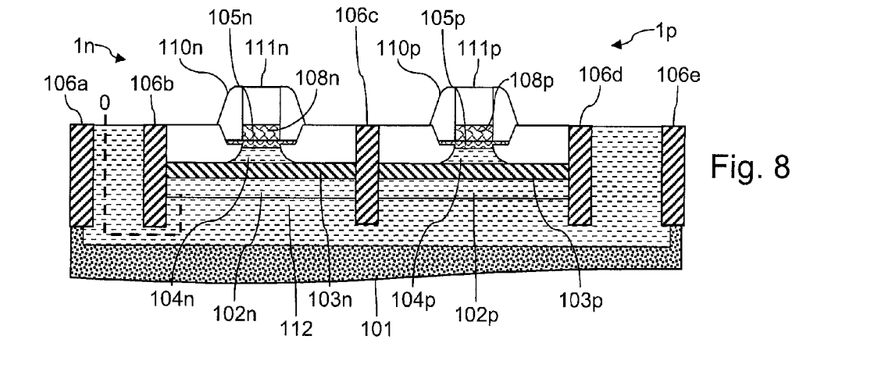
FIG. 8 is a view in section of a nMOS transistor and a pMOS transistor contiguously joined together in a fifth variant of a 6T memory.

FIG. 8 shows a fifth variant of the transistors of the memory cell 4. An nMOS transistor in and a pMOS transistor 1$p$ are contiguously joined together in the memory cell 4. The transistors 1$n$ and 1$p$ are made by FDSOI technology. This fifth variant differs from the third variant solely by an N-type doping of the ground planes of the memory cell 4. As compared with this third variant, the nMOS transistors have a lower voltage threshold and the pMOS transistors have a higher voltage threshold.

For the first to fifth variants illustrated in FIGS. 4 to 8, the transistors 1$n$ and 1$p$ have gates with an N-type work function. Naturally, it is possible rather to form transistors 1$n$ and 1$p$ whose gates have a P-type work function to enable the threshold voltages to be modulated.

In the first to fifth variants, a block of memory cells includes a multitude of memory cells which have a common well and for which the transistor gates have a same work function. This block extends over a zone having a common well. This common well is separated from the logic block.

For the second and fourth variants, a matrix of memory cells can be surrounded by a deep well biased to Vdd, in order to provide for appropriate separation of the transistors from the adjacent logic gates. This increases the range of adjustment of voltage and isolates the transistors from the substrate noises.

Figure 12:
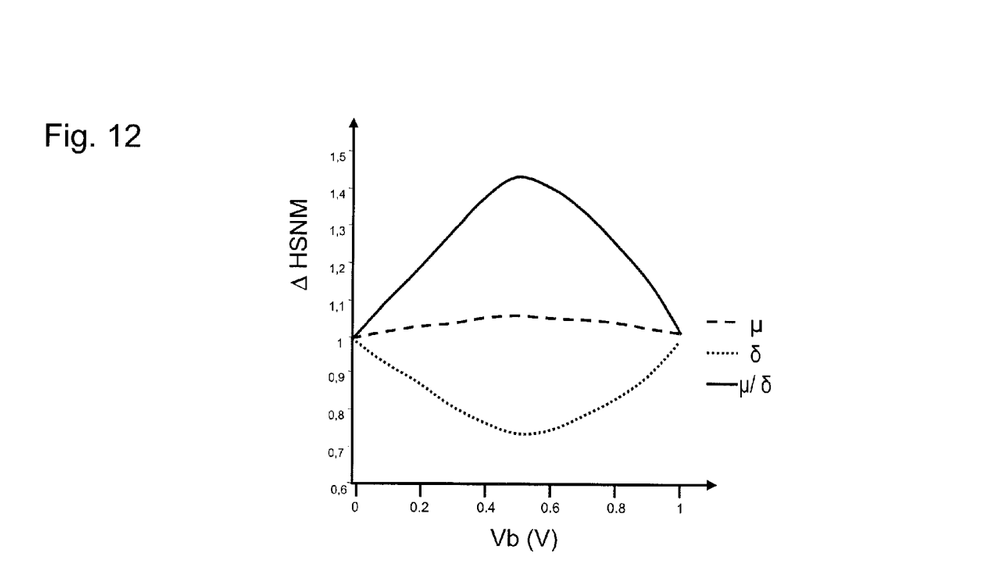
FIGS. 12 to 14 are graphs illustrating the performance values of a memory cell as a function of the biasing of the ground planes.
Figure 13:
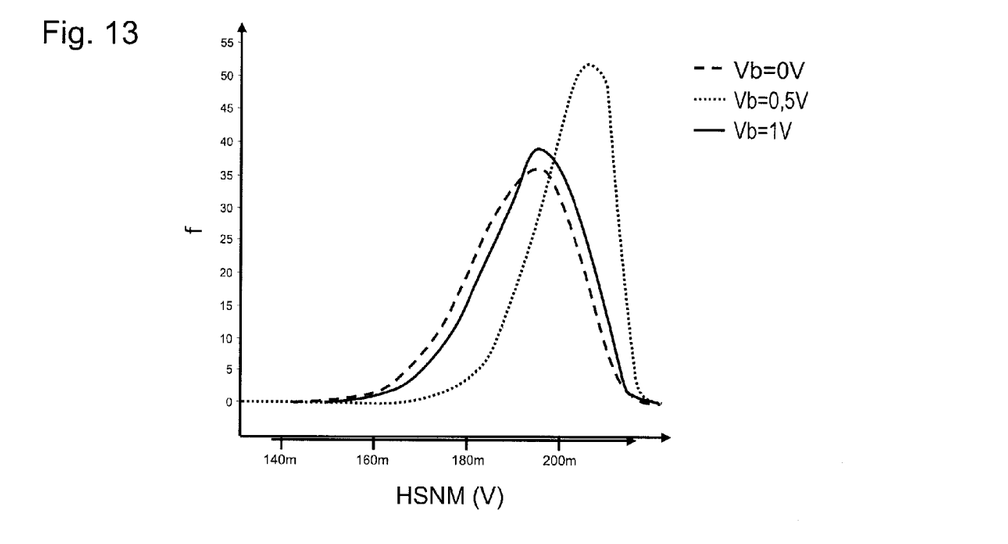
Figure 14:
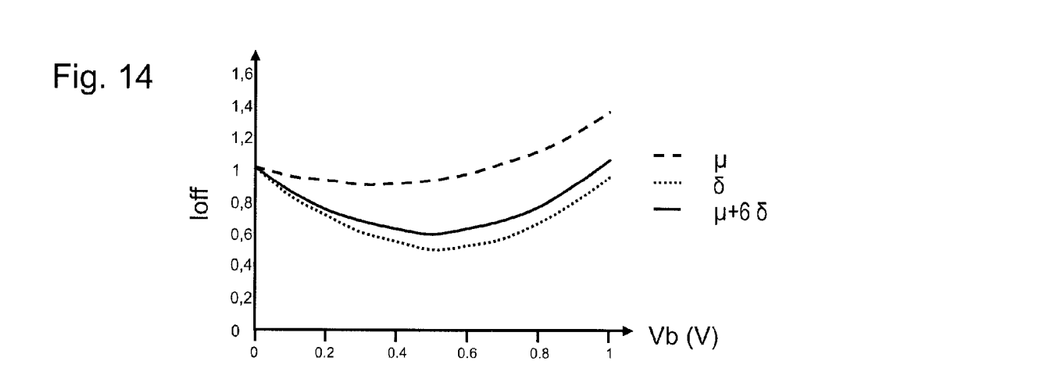

The graphs of FIGS. 12 to 14 illustrate the influence of the bias voltage of the ground planes on a 6T type memory cell 4, made according to the fourth or fifth variants, with a gate having a P-type work function. The graph of FIG. 12 illustrates the variation in the HSNM (Hold Static Noise Margin: these are standardized values relatively to a cell at VB=0) of the cell as a function of the bias voltage Vb of the ground planes. The graph of FIG. 13 illustrates the distribution of the HSNM as a function of the bias voltage Vb. It is noted that the variation in HSNM has an optimum for a value of Vb equal to 0.5V corresponding to a minimum and maximum average value of HSNM. It is therefore possible to find a value of Vb for which the memory cell shows greater stability in retention, thus enabling its power supply to be adapted so as to reduce its electrical consumption. The invention therefore proves to be particularly advantageous since it enables the value of Vb to be easily adapted.

The graph of FIG. 14 illustrates the leakage current (values standardized relatively to a cell at VB=0) of a cell 4 on standby. It is noted that this leakage current shows a minimum for a value of Vb equal to 0.5V. It is therefore possible to find a value of Vb for which the memory cell has reduced electrical consumption in the standby state. The invention therefore proves to be particularly advantageous since it makes it easy to adapt the value of Vb. Such a drop in leakage current in the standby state can be explained by an efficient distribution of the leakage currents between the nMOS and the pMOS transistors for such a value of Vb, thus reducing the influence of manufacturing dispersions on the leakage current.

Figure 15:
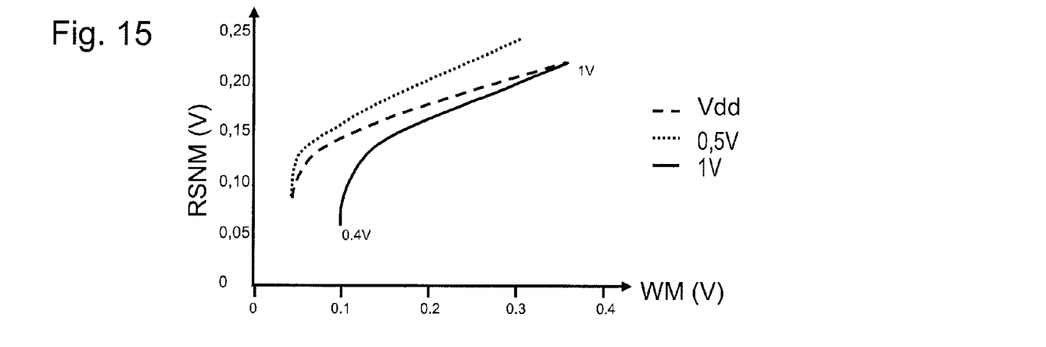
FIG. 15 is a graph illustrating the possibilities of control of a memory cell in read/write mode.

The graph of FIG. 15 illustrates the influence of the control of the voltage of the ground planes on reading stability (RSNM) and on the write margin (WM), for different supply voltages (ranging from 0.4V to 1V in the graph). It is noted that the voltage VB enables the value of RSNM and WM to be adjusted over a wide range to obtain the most efficient compromise as a function of the supply voltage applied. There is thus an additional parameter available to configure the cell 4 with a wide range of compromise between read stability and write stability.

Figure 16:
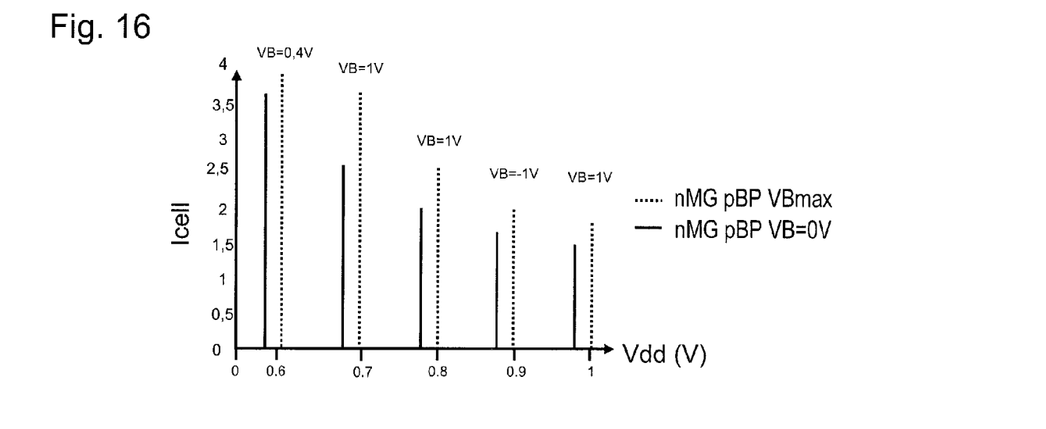
FIG. 16 is a graph illustrating the increase in the reading currents by adjustment of the threshold voltages by biasing of the ground planes in one particular case.

FIG. 16 is a graph illustrating the potential increase of the read currents Icell (values standardized with reference to a memory cell in equivalent bulk technology) of a 6T type memory cell 4 by adjustment of the threshold voltages in biasing its ground planes appropriately. This example corresponds to a case where the transistors of the memory cell 4 have an N-type work function with a P-doped ground plane.

It is observed that, as compared with a zero ground plane bias (shown in solid lines), a ground plane bias with an appropriately chosen value Vb (represented by dashes) appreciably increases the read current.

By a dynamic control of the ground plane bias voltage Vb, it is possible to switch over the operation of a transistor between a search for lower consumption and a search for higher switching speed.

Although an illustration has been provided only of the application of the invention to 6T type memory cells according to FIG. 3, the invention can also be applied to any other memory cell, such as a 4T type or an 8T type memory cell.

Figure 17:
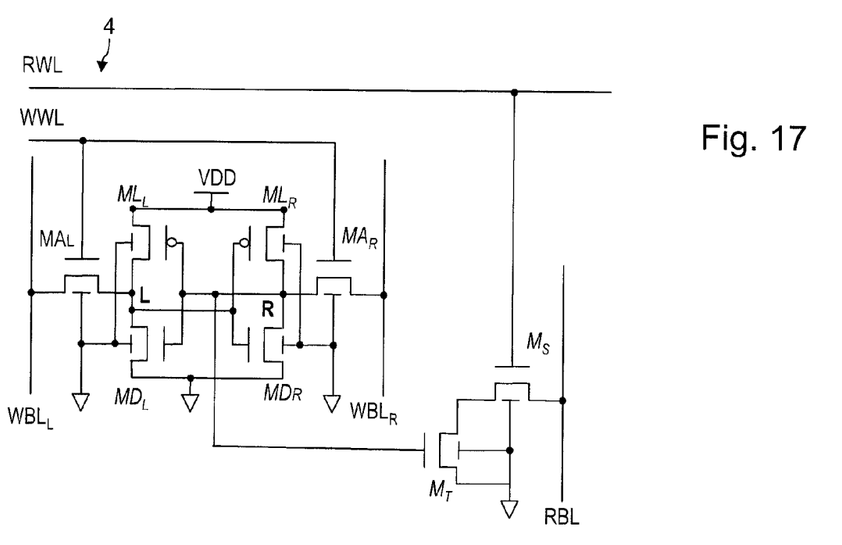
FIG. 17 is an electrical diagram of an example of an 8T type memory cell.

FIG. 17 illustrates an example of an 8T type memory cell 4 such as this. The memory cell 4 has two nMOS-type access transistors $MA_L$ and $MA_R$, two nMOS-type conduction transistors $MD_L$ and $MD_R$ and two pMOS-type load transistors $ML_L$ and $ML_R$. The conduction transistors $MD_L$ and $MD_R$ and the load transistors $ML_L$ and $ML_R$ are connected in a manner known per se to form a bistable flip-flop circuit having storage nodes L and R. The storage nodes L and R are selectively connected to the voltage Vdd respectively by means of the load transistors $ML_L$ and $ML_R$. The storage nodes L and R are selectively connected to ground respectively by means of the conduction transistors $MD_L$ and $MD_R$. The storage nodes L and R are selectively connected to the write bit lines $WBL_L$ and $WBL_R$ respectively by means of the access transistors $MA_L$ and $MA_R$. The gate of the access transistors $MA_L$ and $MA_R$ is connected to a word write line WWL. The gate of the load transistor $ML_L$ and the gate of the conduction transistor $MD_L$ are connected to the storage node R. The gate of the load transistor $ML_R$ and the gate of conduction transistor $MD_R$ are connected to the storage node L. The memory cell 4 also has nMOS transistors Ms and Mt, series-connected between ground and a read bit line RBL. The gate of the transistor Mt is connected to the gate of the transistor Mll. The gate of the transistor Ms is connected to the word read line RWL.

The nMOS transistors $MA_L$ and $MD_L$ are made on a BOX insulating layer and overhang a ground plane. The pMOS-type load transistors $ML_L$ and $ML_R$ are made on the BOX insulating layer and overhang a ground plane. The gates of the transistors of the memory cell 4 all have a same work function. The doping of the ground planes of the transistors of the memory cell 4 is identical. The biasing of these ground planes is also identical. In this example, the ground planes of the transistors are all connected to the ground potential. The ground planes of the transistors are all made on a same well.

Whatever the number of transistors of the memory cell 4, the gates of its transistors will have a same work function. Its transistors will advantageously have a same doping of its ground planes, a same bias of its ground planes and a same well in which these ground planes are made.

The invention claimed is:

1. A manufacture comprising an integrated circuit comprising a semiconductor substrate, logic gates, and a memory, said logic gates comprising FDSOI-type transistors made on said substrate, including at least one first transistor comprising a gate with a first work function, and including at least one second transistor comprising a gate with a second work function distinct from said first work function, said memory including a plurality of memory cells, each memory cell comprising FDSOI type transistors, wherein at least one third transistor is an nMOS transistor that comprises a gate presenting a third work function, a buried insulating layer, and a ground plane separating said buried insulating layer from said substrate, and wherein at least one fourth transistor is a pMOS transistor that comprises a gate presenting said third work function, a buried insulating layer, and a ground plane separating said buried insulating layer from said substrate, said ground planes of said third and fourth transistors having common doping, being made in a well separating said ground planes from said substrate, and being adapted to be biased in the same way.

2. The manufacture of claim 1, wherein said well is a well with p-type doping that is separated from said substrate by a deep n-well.

3. The manufacture of claim 1, wherein said first and second transistors comprise a buried insulating layer and a respective ground plane separating said buried insulating layer from said substrate, wherein ground planes of said first and second transistors have distinct doping.

4. The manufacture of claim 1, wherein said first and second transistors comprise a buried insulating layer and a respective ground plane separating said buried insulating layer from said substrate, wherein ground planes of said first and second transistors have distinct biases.

5. The manufacture of claim 1, wherein said buried insulating layer of said third and fourth transistors has a thickness of less than 50 nanometers.

6. The manufacture of claim 1, wherein said third work function is substantially identical to one of said first work function and said second work function.

7. The manufacture of claim 1, wherein, the respective gates of the first to fourth transistors include a poly-silicon layer, wherein the first gate presents the first work function having a doping of a first type, the second gate presents the second work function having a doping of a second type opposite said first type, and wherein the third gate presents the third work function having a doping of one of said first and second type.

8. The manufacture of claim 1, wherein each memory cell further comprises fifth and sixth FDSOI transistors, said fifth transistor being an nMOS transistor and comprising a gate presenting a third work function, a buried insulating layer, and a ground plane separating said buried insulating layer from said substrate, and said sixth transistor being a pMOS transistor and comprising a gate presenting a third work function, a buried insulating layer, and a ground plane separating said buried insulating layer from said substrate.

9. The manufacture of claim 8, wherein said memory is an SRAM memory.

10. The manufacture of claim 1, further comprising a circuit for biasing said ground plane of said third transistor and said ground plane of said fourth transistor, said biasing circuit being configured to dynamically modify biasing applied to said ground planes of said third and fourth transistors.

11. The manufacture of claim 1, wherein said ground planes of a set of transistors of said memory cells are made in a common well.

12. The manufacture of claim 1, wherein said ground planes of said third and fourth transistors are biased through their respective wells.

13. A manufacture comprising an integrated circuit in which respective gates of first to fourth transistors include a poly-silicon layer, wherein a first gate presents a first work function having a doping of a first type, a second gate presents a second work function having a doping of a second type opposite said first type, and wherein a third gate presents a third work function having a doping of one of said first and second type, wherein said third gate includes a buried insulating layer, a substrate and a ground plane separating said buried insulating layer from said substrate, and wherein said ground plane of said third transistor is made in a well separating said ground plane from said substrate.

* * * * *